(12) United States Patent  
Watkins et al.

(10) Patent No.: US 9,435,835 B2
(45) Date of Patent: Sep. 6, 2016

(54) VALIDATION OF ELECTRIC POWER SYSTEM MONITORING SYSTEMS

(75) Inventors: Matthew B. Watkins, Allen, TX (US); Normann Fischer, Colfax, WA (US); David M. Prestwich, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 1293 days.

(21) Appl. No.: 13/335,547

(22) Filed: Dec. 22, 2011

(65) Prior Publication Data

US 2012/0166141 A1 Jun. 28, 2012

Related U.S. Application Data

(60) Provisional application No. 61/427,258, filed on Dec. 27, 2010.

(51) Int. Cl.
*G01R 35/00* (2006.01)
*G01R 19/25* (2006.01)

(52) U.S. Cl.
CPC .......... *G01R 19/2513* (2013.01); *G01R 35/00* (2013.01)

(58) Field of Classification Search
CPC ...................................................... G01R 35/00
USPC ......................................................... 702/183
See application file for complete search history.

(56) References Cited

U.S. PATENT DOCUMENTS

| | | | |
|---|---|---|---|
| 4,314,199 A | 2/1982 | Yamaura | |
| 5,493,228 A | 2/1996 | Eriksson | |
| 6,525,543 B1 | 2/2003 | Roberts | |
| 6,590,397 B2 | 7/2003 | Roberts | |
| 6,694,270 B2 | 2/2004 | Hart | |
| 6,845,333 B2 | 1/2005 | Anderson | |
| 7,345,488 B2 | 3/2008 | Fischer | |
| 7,460,347 B2 | 12/2008 | Schweitzer | |
| 8,131,401 B2 | 3/2012 | Nasle | |
| 8,321,162 B2 | 11/2012 | Labuschagne | |
| 2003/0101008 A1 | 5/2003 | Hart | |
| 2006/0193099 A1 | 8/2006 | Schweitzer | |
| 2007/0206644 A1 | 9/2007 | Bertsch | |

(Continued)

OTHER PUBLICATIONS

Dave Dolezilek, Robin Jenkins, Mike Agudo, Dave Fox, Case Study: Integrate Substation IEDs to Provide Reliable, Independent Dual-Primary Remedial Action Schemes, Mar. 15, 2006.

(Continued)

*Primary Examiner* — Bryan Bui
(74) *Attorney, Agent, or Firm* — Stoel Rives, LLP; Richard M. Edge

(57) ABSTRACT

The present disclosure provides systems and methods for validating electric power delivery monitoring systems, including, but not limited to, current transformers (CTs) and voltage potential transformers (PTs). According to various embodiments, a first IED monitors a portion of an electric power delivery system via one or more CTs and/or PTs. A second IED monitors the portion of the electric power delivery system via one or more additional CTs and/or PTs. Each IED may generate an event report, containing measurement data, associated with each respective measurement equipment. A validation module may compare the event reports in order to validate that the IEDs and/or the underlying measurement equipment are functioning correctly. According to various embodiments, the validation module may be configured to align the event reports from two IEDs using an event trigger common to both IEDs.

27 Claims, 9 Drawing Sheets

(56) References Cited

U.S. PATENT DOCUMENTS

| | | |
|---|---|---|
| 2008/0065270 A1* | 3/2008 | Kasztenny .......... H02J 13/0065 700/286 |
| 2009/0063122 A1 | 3/2009 | Nasle |
| 2010/0125373 A1 | 5/2010 | Labuschagne |
| 2011/0022734 A1 | 1/2011 | Etheridge |
| 2011/0181269 A1 | 7/2011 | Watkins |

OTHER PUBLICATIONS

Jeff Roberts, Edmund O. Schweitzer, III, Analysis of Event Reports, 1990.

David Costello, Understanding and Analyzing Event Report Information, Oct. 9, 2000.

David Costello, Lessons Learned Analyzing Transmission Faults, Sep. 13, 2007.

Todd Rosenberger, David Prestwich, Matthew Watkins, Mark Weber, Automated Event Retrieval Reduces Operating Costs, Dec. 16, 2008.

Casper Labuschagne, Normann Fischer, Transformer Fault Analysis Using Event Oscillography, September 15, 2006.

PCT/US2011/067205 Patent Cooperation Treaty, International Search Report and Written Opinion of the International Searching Authority, Apr. 24, 2012.

* cited by examiner

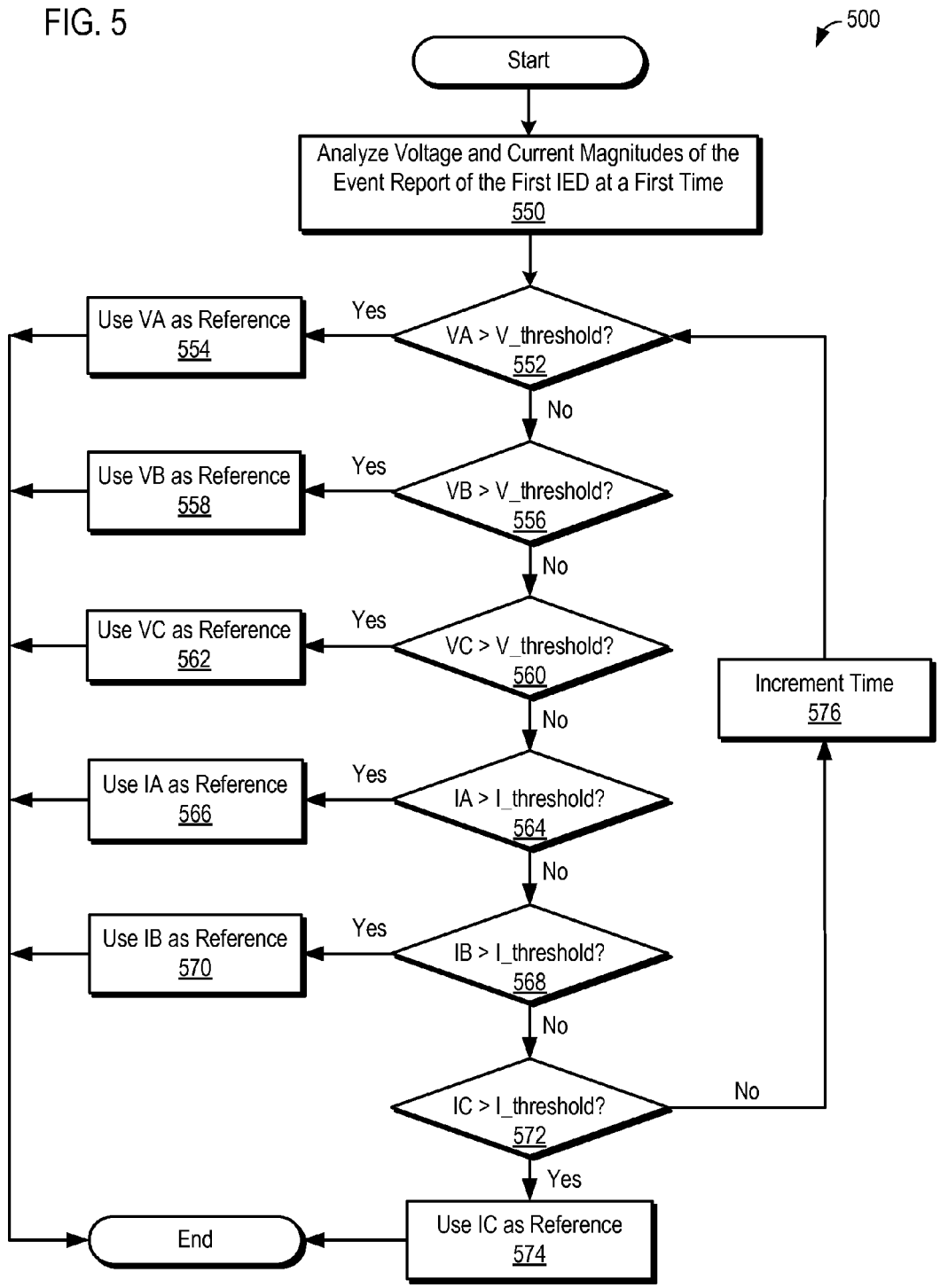

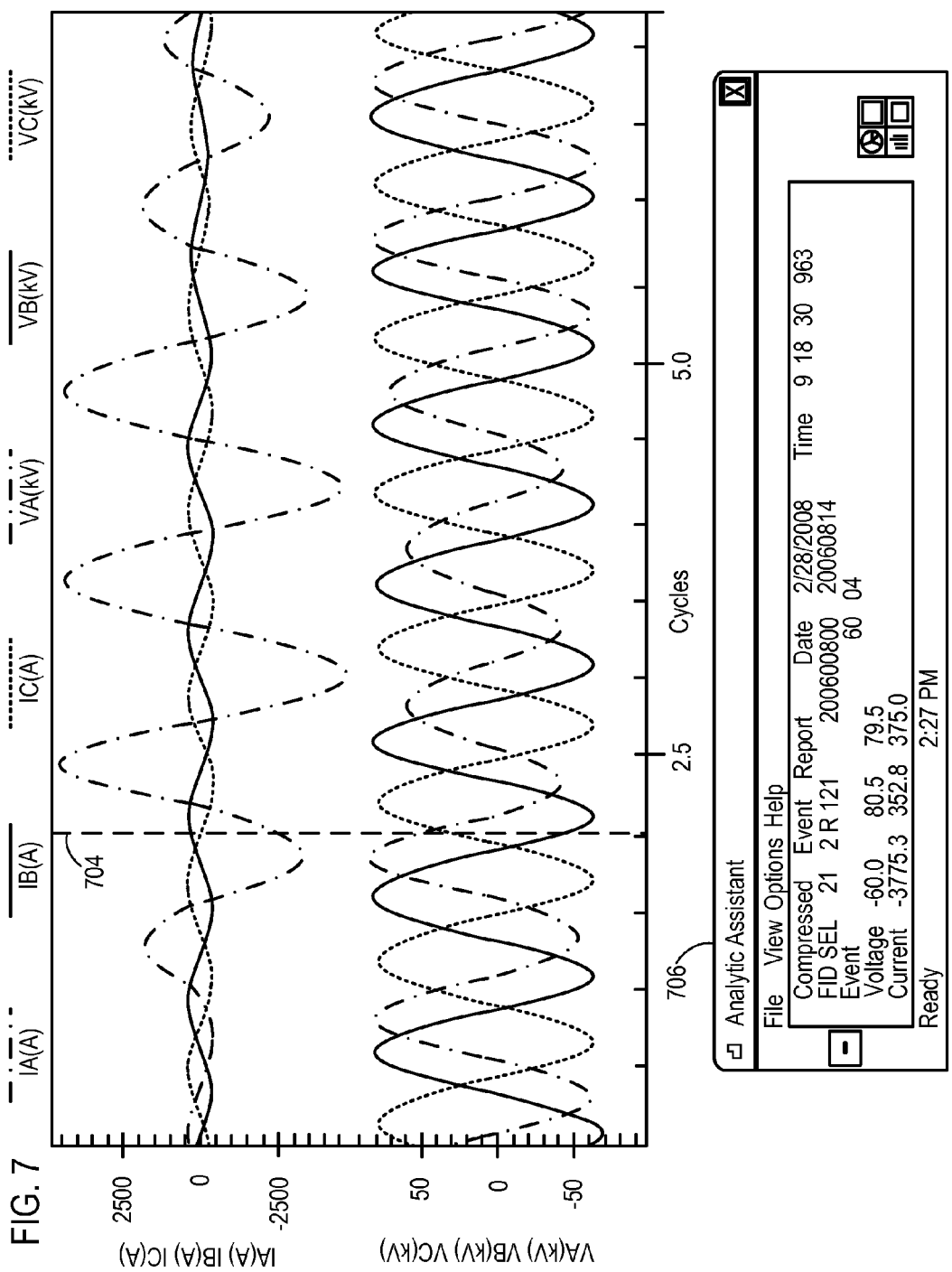

VALIDATION OF ELECTRIC POWER SYSTEM MONITORING SYSTEMS

RELATED APPLICATIONS

The present application claims the benefit under 35 U.S.C. §119(e) of U.S. Provisional Patent Application No. 61/427,258 filed Dec. 27, 2010 and titled "Validation of Electric Power System Measurement Equipment," which application is incorporated herein by reference in its entirety.

TECHNICAL FIELD

This disclosure relates to validation and measurement systems and methods in electric power delivery systems. More particularly, this disclosure relates to systems and methods for validating measurements made by unsynchronized devices or time-synchronized devices.

BRIEF DESCRIPTION OF THE DRAWINGS

Non-limiting and non-exhaustive embodiments of the disclosure are described, including various embodiments of the disclosure with reference to the figures, in which:

FIG. 5 illustrates an example of a flow diagram of a method for selecting a reference time when a reference quantity is above a predetermined threshold.

FIG. 7 illustrates an oscillography event report generated by a second IED, including voltage and current measurements for three phases of power in an electric power delivery system.

Figure 1:
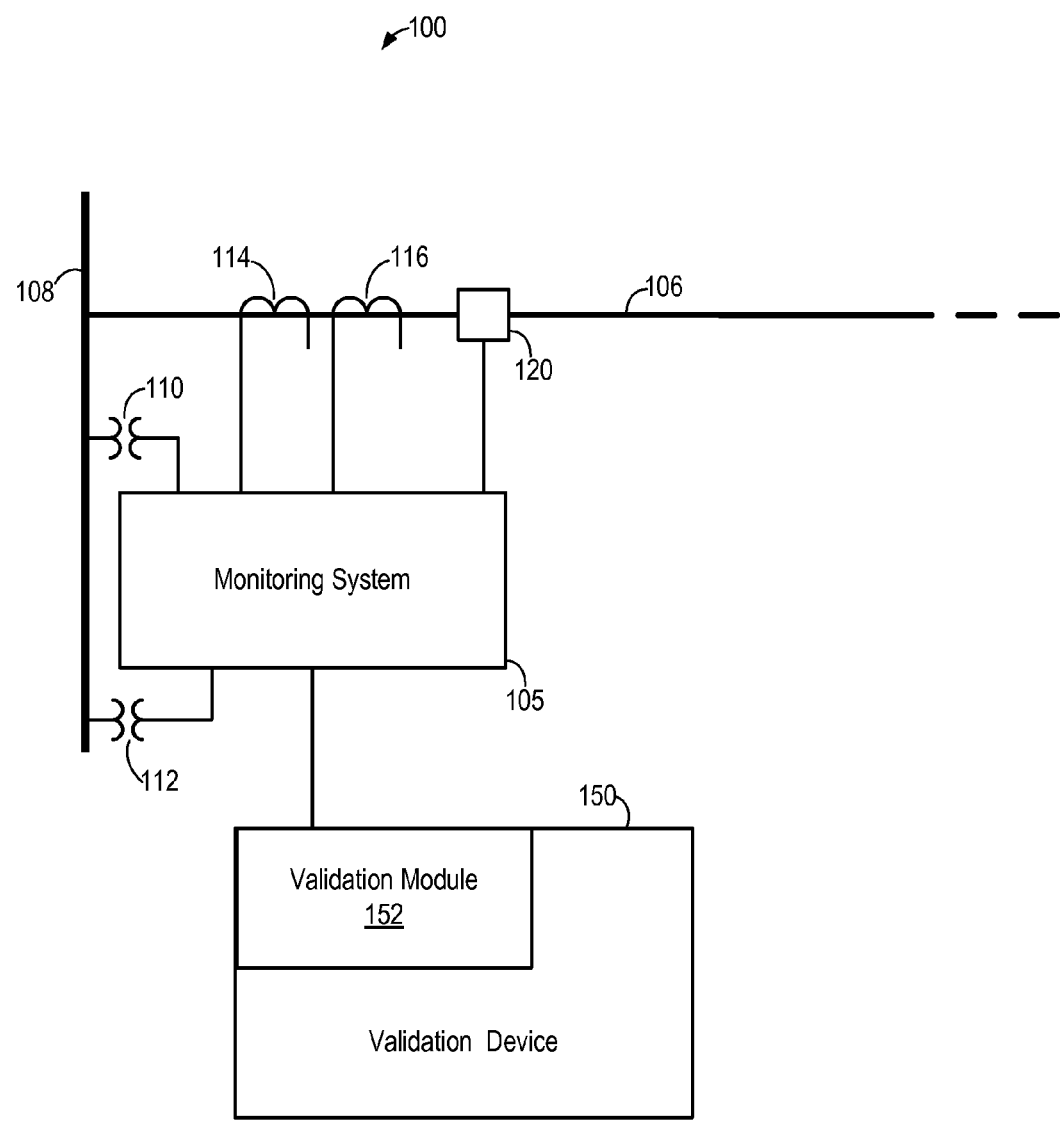
FIG. 1 illustrates a one-line diagram of an electric power delivery system, including various voltage potential transformers (PTs) and current transformers (CTs), a monitoring system, and a validation device.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Intelligent electronic devices (IEDs) may be used for monitoring, protecting and/or controlling industrial and utility equipment, such as in electric power delivery systems. IEDs may be configured to obtain measurement information from current transformers (CTs) and/or voltage potential transformers (PTs). IEDs may be configured to obtain measurement information from a variety of other sources, such as optical current transducers, Rogowski coils, light sensors, relays, temperature sensors, and similar, as well as from measurements, signals, or data provided by other IEDs. IEDs within a power system may be configured to perform metering, control, and protection functions that require a certain level of accuracy. Accordingly, the accuracy of measurement equipment, such as CTs and PTs and possibly even IEDs associated therewith may be monitored and/or validated on a regular basis to ensure that they are functioning correctly. In fact, in some instances, regulations and protocols may require that the accuracy of critical measurement equipment be validated on a regular basis.

According to various embodiments, a monitoring system may obtain signals from the electric power system using a first measurement equipment and a second measurement equipment. The monitoring system may be in communication with the first measurement equipment and the second measurement equipment. The monitoring system may include the first measurement equipment and the second measurement equipment. The monitoring system may collect a first set of measurement data from the first measurement equipment and a second set of measurement data from the second measurement equipment.

For example, the monitoring system may comprise a first IED and a second IED, each IED configured to monitor specific equipment or a specific segment of an electric power delivery system by receiving signals therefrom using a CT. The first IED may collect measurement data obtained by a first CT from one phase of power. The second IED may collect measurement data obtained by a second CT from the same phase of power on the same equipment or segment of the electric power delivery system. The collected measurement data from the first IED may be aligned with the collected measurement data from the second IED.

In some embodiments, the first and second IEDs may utilize a common time source, such as a time signal provided by a global positioning system (GPS) or via a time-syncing standard such as IEEE 1588. Accordingly, the first and second IEDs may be inherently time-aligned and synchrophasors may be calculated. Additionally, the first and second IEDs may utilize identical or similar sampling and processing algorithms in order to further facilitate the calculations of accurate synchrophasors.

However, in many situations, the first and second IEDs may utilize unsynchronized time signals and/or alternative sampling and processing algorithms. For example, two IEDs may be different models or and/or utilize independent time signals. In such embodiments, the data collected may not be inherently time-aligned or easily time-aligned using time stamps associated with the data. If different model IEDs are used and/or the IEDs are not time-aligned, then, in some embodiments, an event trigger common to both IEDs may be used to align the measurement data from each IED. For example, each IED may be configured to begin collecting data when a power system event or anomaly is detected, such as when an overcurrent is detected. Although not time-aligned, and potentially not using the same sampling algorithm, the two IEDs may independently detect the overcurrent and generate a common event trigger. The common event trigger may be used to align the measurement data collected by each IED.

With the measurement data from each IED aligned, a validation device, or a validation module within one or both of the IEDs, may calculate phasor amplitudes and/or angles for each IED at a time corresponding to the common event trigger. The calculated phasor amplitudes and/or angles for the measurement data collected by each IED should be approximately the same, since they are aligned with respect to one another using the common event trigger. The validation module may compare the calculated phasor magnitudes and/or angles from the first IED with the calculated phasor magnitudes and/or angles from the second IED. The validation module may validate the first and/or second measurement equipment, so long as the phasor magnitudes and/or angles from the first and second IEDs are equal or within an acceptable range of one another. If the calculated phasor magnitudes and/or angles are not within an acceptable range of one another, the validation module may transmit a signal indicating that the monitoring system (IEDs and/or one or both of the pieces of measurement equipment) is malfunctioning.

In some embodiments the first IED and the second IED may function as primary and backup IEDs, respectively. In other embodiments, the first IED and the second IED may function as dual-primary IEDs. Additionally, any number of IEDs may be used in conjunction with the validation systems and methods described herein. For example, three or four IEDs may be utilized to validate one another in a primary-backup combination or as a plurality of primary IEDs. Throughout the specification, CTs and PTs are used as examples of measurement equipment. However, it should be understood that the present systems and methods may be used in conjunction with any of a wide variety of measurement equipment, including, but not limited to, CTs, PTs, temperature sensors, light sensors, Rogowski coils, optical current transducers, generators, transformers, transmission lines, buses, circuit breakers, capacitor banks, switches, voltage regulators, and tap changers.

In various embodiments, the systems and methods described herein may be expanded for use in an enterprise environment in which a validation module or validation device may be in communication with any number (i.e. hundreds or even thousands) of pairs of IEDs functioning in dual-primary or primary-backup configurations. Accordingly, a centralized validation system may be capable of remotely validating the functionality of measurement equipment and/or IEDs throughout an electric power delivery system. Similarly, a validation module or validation device may be adapted to monitor and regularly validate the functionality of measurement equipment and/or IEDs within a substation of an electric power delivery system.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term IED may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires". The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates simplified one-line diagram of an electric power delivery system 100 that is monitored, protected, controlled, and/or metered by a monitoring system 105. As is described in greater detail below, monitoring system 105 may comprise one or more intelligent electronic devices (IEDs). Electric power delivery system 100 may include a bus 108, and a conductor 106. Electric power delivery system 100 may comprise a transmission system, in which case conductor 106 may be a transmission line. Electric power delivery system 100 may comprise a distribution system, in which case conductor 106 may be a feeder.

In addition to power distribution and transmission lines, monitoring system 105 may be configured to monitor measurement and monitoring devices associated with transformers, generators, distribution lines, transmission lines, buses, circuit breakers, capacitor banks, switches, voltage regulators, tap changers, and/or other monitoring and measurement equipment associated with electric power delivery systems.

Monitoring system 105 may be in communication with measurement equipment, such as current transformers (CTs) 114 and 116 and voltage potential transformers (PTs) 110 and 112. CTs 114 and 116 and PTs 110 and 112 may be configured to generate signals corresponding to electrical conditions of a portion of the electric power delivery system 100. For example, PTs 110 and 112 may be configured to each generate a signal corresponding to the voltage on bus 108. Similarly, CTs 114 and 116 may be configured to each generate a signal corresponding to the current passing through conductor 106. The pair of PTs 110 and 112 may be configured to function in a dual-primary configuration, or in a primary-backup configuration. CTs 114 and 116 may also be configured as dual-primary or primary-backup measurement equipment.

Monitoring system 105 may receive signals from the electric power delivery system using measurement equipment 110, 112, 114, and 116 and generate an event report comprising measurement data. For example, monitoring system 105 may receive the signals from measurement equipment 110, 112, 114, and 116 and generate an event report of measurement data along a time line for each individual piece of measurement equipment 110, 112, 114, and 116. According to various embodiments, monitoring system 105 may begin collecting measurement data from measurement equipment 110, 112, 114, and 116 upon receiving a trigger from an external source. Alternatively, monitoring system 105 may collect measurement data in response to an event trigger. For example, an event trigger may be automatically generated by the monitoring system 105 in response to the detection of an overcurrent, undercurrent, overvoltage, voltage drop, overfrequency, underfrequency, change in frequency, and/or other power system anomaly. Monitoring system 105 may also be configured to actuate breaker 120 and remove conductor 106 from service in response to the detection of an overcurrent, undercurrent, overvoltage, voltage drop, overfrequency, underfrequency, change in frequency, and/or other power system anomaly.

Monitoring system 105 may also be in communication with a validation device 150. Validation device 150 may be configured to receive event reports associated with each piece of measurement equipment 110, 112, 114, and 116. Validation device 150 may record and/or evaluate each of the event reports. In some embodiments, validation device 150 may include a Supervisory Control and Data Acquisition (SCADA) system, a Real-Time Automation Controller (RTAC) or other automation controller, a synchrophasor vector processor (SVP), and/or other such device capable of receiving and processing information from IEDs. Validation device 150 may be in direct communication with monitoring system 105, or may communicate with monitoring system 105 using a network or physical transport of media. Validation device 150 may be in the same building/substation as monitoring system 105, or a remote building or remote location.

Validation device 150 may include a validation module 152 configured to evaluate information received from monitoring system 105. For instance validation module 152 may include computer code configured to process and analyze measurement data contained with event reports received from monitoring system 105. The validation module may be configured to receive the event reports associated with each pair of measurement equipment 110, 112, 114, and 116 monitoring the same portion of the electric power delivery system 100. For example, CTs 114 and 116 may be considered a pair of measurement equipment each monitoring the same electrical condition of conductor 106. Similarly, pair of PTs 110 and 112 may each monitor the same electrical condition of bus 108.

Accordingly, validation module 152 may receive an event report associated with each piece of measurement equipment 110, 112, 114, and 116 in a pair of measurement equipment 110, 112 and 114, 116. Validation module 152 may then compare the two event reports with respect to one another in order to validate each of the measurement equipment with respect to one another. In some embodiments, the event reports and measurement data collected by monitoring system 105 may be time-synchronized, such as in embodiments in which the IEDs within monitoring system 105 are time-synchronized. In such embodiments, synchrophasors may be calculated using the event reports associated with each of CT 114 and 116.

However, in other embodiments, monitoring system 105 may collect unsynchronized measurement data and generate unsynchronized event reports, such as in situations in which monitoring system 105 comprises multiple unsynchronized IEDs. In such embodiments, validation module 152 may be adapted to align the event reports. In some embodiments, the event reports may be aligned using various methods of data alignment. In other embodiments, the event reports may be graphically represented and aligned using automated graphical or image alignment techniques. In still other embodiments, the event reports associated with pairs of measurement equipment may be aligned using common event triggers.

For example, a first IED may generate an event trigger in response to the detection of an overcurrent event via CT 114. A second IED may generate an event trigger in response to the same overcurrent event detected via CT 116. Accordingly, the event trigger may be common to both the first IED and the second IED. While the time stamps for each of the first and second IEDs may be different, validation module 152 may use the common event triggers to align the event reports associated with each of CT 114 and CT 116. Similarly, IEDs receiving signals from PT 110 and PT 112 may generate common event triggers that can be used by validation module 152 to align their associated event reports.

Figure 2A:
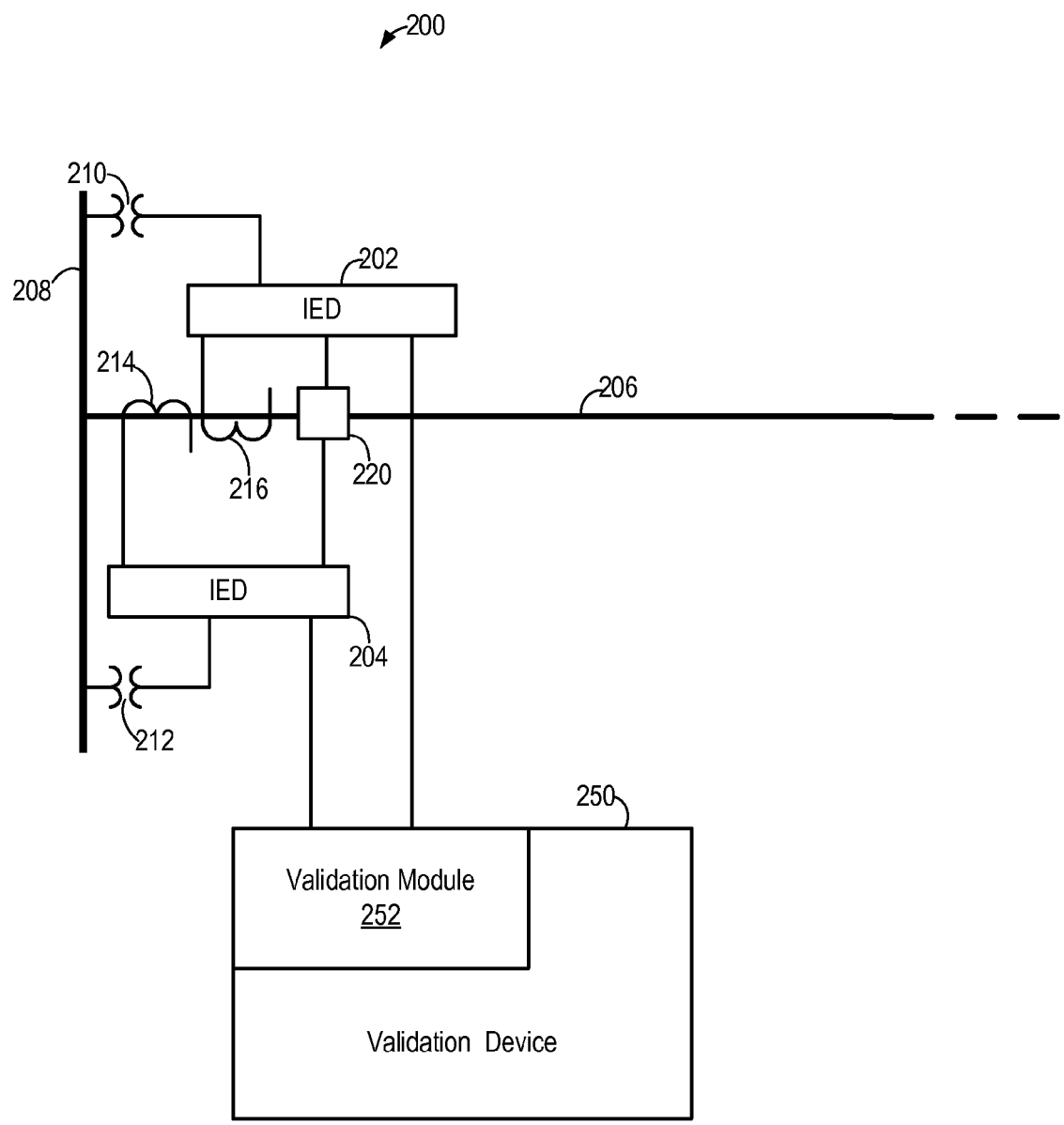
FIG. 2A illustrates a one-line diagram of an electric power delivery system, in which a monitoring system includes two independent intelligent electronic devices (IEDs), the IEDs in communication with a validation device.

FIG. 2A illustrates an example of a one-line diagram of a power delivery system 200, in which a monitoring system (105 of FIG. 1) comprises an IED 202 and an IED 204. As illustrated, IED 202 may be in communication with PT 210 configured to generate a signal corresponding to a voltage potential of bus 208 and CT 216 configured to generate a signal corresponding to a current through conductor 206. IED 204 may be in communication with PT 212 configured to generate a signal corresponding to a voltage potential of bus 208 and CT 214 configured to generate a signal corresponding to a current through conductor 206. IEDs 202 and 204 may be in a dual-primary configuration or in a primary-backup configuration. For example, IED 202 may be considered a primary IED for monitoring conductor 206 and bus 208 via CT 216 and PT 210, respectively. IED 204 may be either a second primary IED or a backup IED for monitoring conductor 206 and bus 208 via CT 214 and PT 212, respectively.

IED 202 may receive signals from each of PT 210 and CT 216 and generate an event report including measurement data. IED 204 may receive signals from each of PT 212 and CT 214 and generate an event report including measurement data. For example each of IEDs 202 and 204 may generate an event report of measurement data along a time line for each respective piece of measurement equipment 210, 212, 214, and 216. According to various embodiments, IEDs 202 and 204 may begin collecting measurement data from the measurement equipment 210, 212, 214, and 216 upon receiving a trigger from an external source. Alternatively, IEDs 202 and 204 may collect measurement data in response to an event trigger. For example, an event trigger may be automatically generated by each of IEDs 202 and 204 in response to the detection of an overcurrent, undercurrent, overvoltage, voltage drop, overfrequency, underfrequency, change in frequency, and/or other power system anomaly. One or both of IEDs 202 and 204 may also be configured to actuate breaker 220 in order to remove conductor 206 from service in response to the detection of an overcurrent, undercurrent, overvoltage, voltage drop, overfrequency, underfrequency, change in frequency, and/or other power system anomaly.

Validation device 250 may be configured to receive event reports associated with each piece of measurement equipment 210, 212, 214, and 216. As illustrated, each of IEDs 202 and 204 may be capable of independently communicating with validation device 250. Alternatively, validation device 250 may communicate with each of IEDs 202 and 204 via a communications network or though the physical transport of media.

As previously described, validation device 250 may include a validation module 252 configured to evaluate event reports associated with measurement equipment 210, 212, 214, and 216. The validation module 252 may be configured to receive the event reports from each pair of measurement equipment, i.e. PTs 210 and 212 monitoring bus 208 and CTs 214 and 216 monitoring conductor 206. Validation module 252 may compare the event reports associated with PT 210 to the event reports associated with PT 212. Similarly, validation module 252 may compare the event reports associated with CT 216 to the event reports associated with CT 214. IEDs 202 and 204 may be different models and/or utilize unsynchronized time signals. Accordingly, the event reports of measurement equipment 210, 212, 214, and 216 in a pair of measurement equipment 210, 212 and 214, 216 may not be time-synchronized. In such embodiments, validation module 252 may be adapted to align the event reports. The event reports may be aligned using various methods of data alignment. In other embodiments, the event reports may be graphically represented and aligned using automated graphical or image alignment techniques. Alternatively, the event reports associated with each pair of measurement equipment 210, 212 and 214, 216 may be aligned using common event triggers.

For example, IED 204 may generate an event trigger in response to an overcurrent event on conductor 206 detected via CT 214. IED 202 may generate an event trigger in response to the same overcurrent event on conductor 206 detected via CT 216. Accordingly, the event trigger may be common to both IED 202 and IED 204. While the time stamps for each of IEDs 202 and 204 may be different, validation module 252 may use the common event triggers to align the event reports associated with each of CT 214 and CT 216. Similarly, the event reports associated with each of PT 210 and PT 212 may be aligned using common event triggers.

Figure 2B:
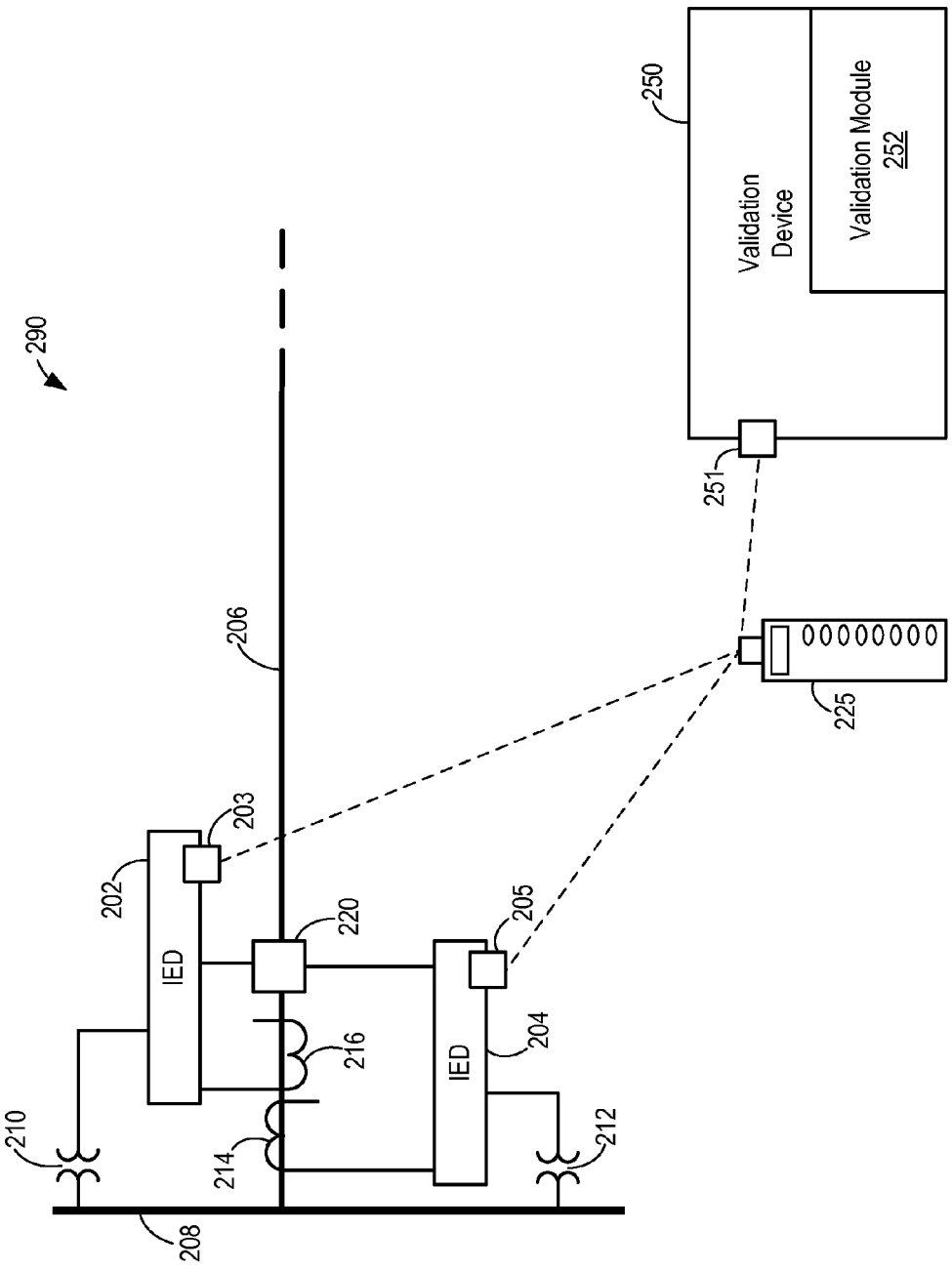
FIG. 2B illustrates another one-line diagram of an electric power delivery system, in which a data transfer device is used to collect data from each IED and supply it to the validation device.

FIG. 2B illustrates an alternative embodiment of a one-line power delivery system 290, in which a data transfer device 225 is used to collect the event reports from each IED 202 and 204. The data transfer device may be an SEL-4391 Data Courier®, available from Schweitzer Engineering Laboratories, Inc. in Pullman, Wash. The data transfer device may be any device capable of performing the functions of collecting and distributing data from the IEDs, such as a laptop computer, a tablet computer, a smart phone, or the like. As illustrated, rather than being directly connected to validation device 250, each IED 202 and 204 may include a data port 203 and 205, respectively, adapted to transfer event reports associated with various measurement equipment, such as CTs 214 and 216 and PTs 210 and 212, to data transfer device 225 via data port 251. Data transfer device 225 may then be used to transfer the event reports to validation device 250.

Again, validation device 250 may include a validation module 252 configured to evaluate event reports associated with each piece of measurement equipment 210, 212, 214, and 216. The validation module may receive the event reports from each pair of measurement equipment, i.e. PTs 210 and 212 monitoring bus 208 and CTs 214 and 216 monitoring conductor 206. Validation module 252 may compare the event reports associated with PT 210 to the event reports associated with PT 212, and validation module 252 may compare the event reports associated with CT 216 to the event reports associated with CT 214. As previously described, the event reports associated with measurement equipment in a pair of measurement equipment may not be time-synchronized. Accordingly, validation module 252 may be adapted to align the event reports using common event triggers, as described above.

Figure 3:
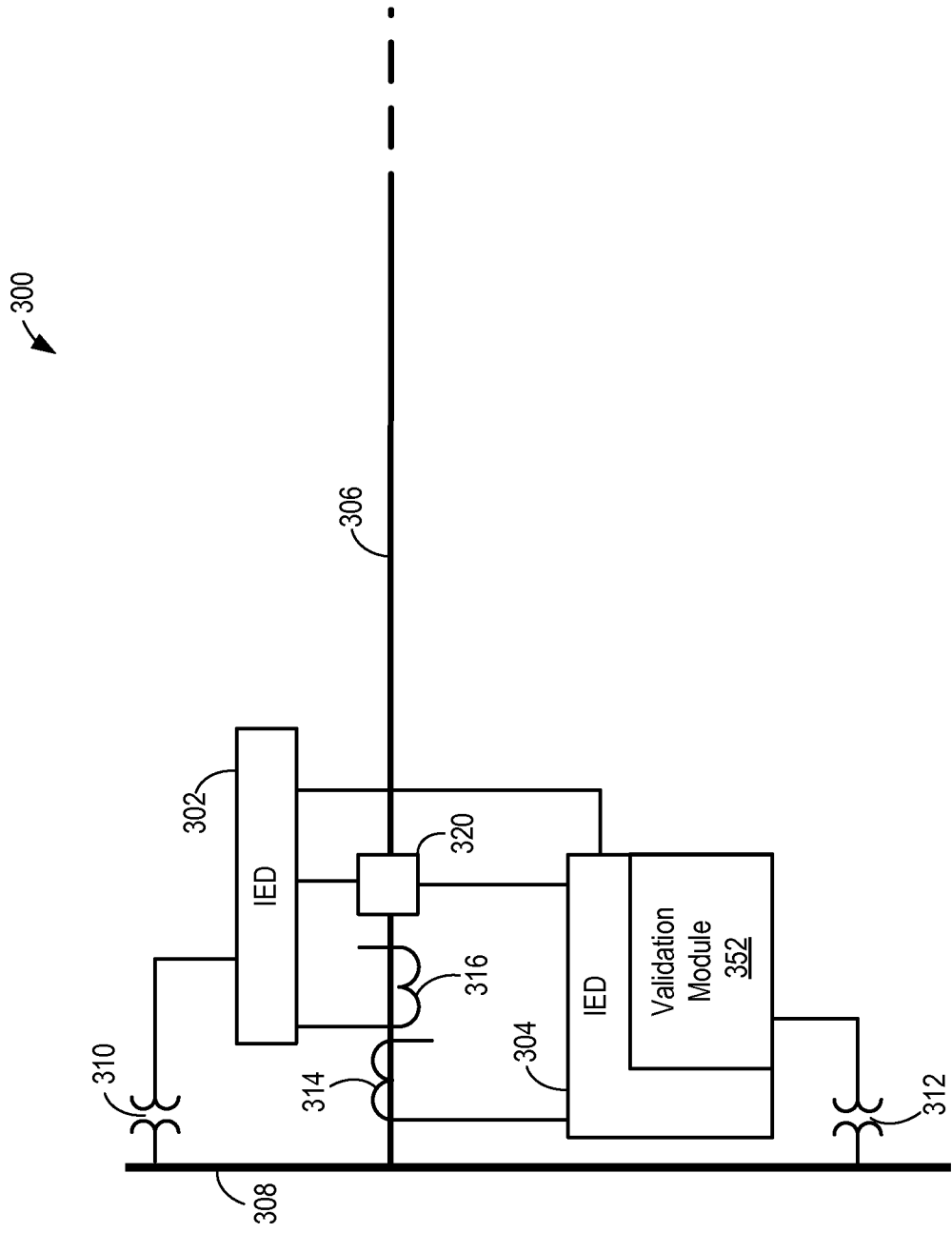
FIG. 3 illustrates another one-line diagram of an electric power delivery system, including two IEDs configured to monitor various CTs and PTs, one of the IEDs including an integrated validation module.

FIG. 3 illustrates another alternative embodiment of an electric power delivery system 300, in which a validation module 352 is integrated within an IED 304. In the illustrated one-line diagram of an electric power delivery system 300, an IED 304 may monitor, protect, and/or control various aspects of electric power delivery system 300. For example, IED 304 may monitor line 306 via CT 314. IED 304 may also monitor bus 308 via PT 312. IED 304 may actuate breaker 320 in order to remove line 306 from service in response to the detection of an overcurrent, undercurrent, overvoltage, voltage drop, overfrequency, underfrequency, change in frequency, and/or other power system anomaly. IED 304 may receive and collect measurement data from signals generated by each of CT 314 and PT 312. IED 304 may generate an event report, including measurement data, based on the signals provided by each of CT 314 and PT 312.

In various embodiments, IED 302 may be configured to function with respect to IED 304 in a dual-primary configuration or in a primary-backup configuration. IED 302 may monitor, protect, and/or control various aspects of line 306 and bus 308. For example, IED 302 may monitor line 306 via CT 316. IED 302 may also monitor bus 308 via PT 310. IED 304 may actuate breaker 320 in order to remove line 306 from service in response to the detection of an overcurrent, undercurrent, overvoltage, voltage drop, overfrequency, underfrequency, change in frequency, and/or other power system anomaly. IED 302 may receive and collect measurement data from signals generated by each of CT 316 and PT 310. IED 302 may generate an event report including the measurement data based on the signals provided by each of CT 316 and PT 310.

As illustrated, IED 304 may include an integrated validation module 352 configured to receive event reports associated with each of CT 314 and PT 312 generated by IED 304, and event reports associated with each of CT 316 and PT 310 generated by IED 302. Validation module 352 may evaluate the event reports associated with CT 314 and CT 316 in order to validate the functionality of CTs 314 and 316 and/or IEDs 304 and 302. Similarly, validation module 352 may evaluate the event reports associated with PT 312 and PT 310 in order to validate the functionality of PT 312 and PT 310 and/or IEDs 304 and 302.

As previously described, IEDs 302 and 304 may be different models and/or utilize unsynchronized time signals. Accordingly, the event reports associated with each pair of measurement equipment, such as CTs 314 and 316, may not be time-synchronized. Validation module 352 may be adapted to align the event reports using an event trigger common to both IED 302 and 304. Alternatively, the event reports may be aligned using various methods of data alignment, graphical alignment, and/or image alignment.

For example, IED 304 may generate an event trigger in response to the detection of a voltage drop on bus 308 via PT 312. IED 302 may generate an event trigger in response to the same voltage drop on bus 308 detected via PT 310. Accordingly, while the time stamps within the event reports created by the two IEDs 302 and 304 may be different, validation module 352 may use the common event triggers to align the event reports associated with each of PT 310 and PT 312.

Figure 4A:
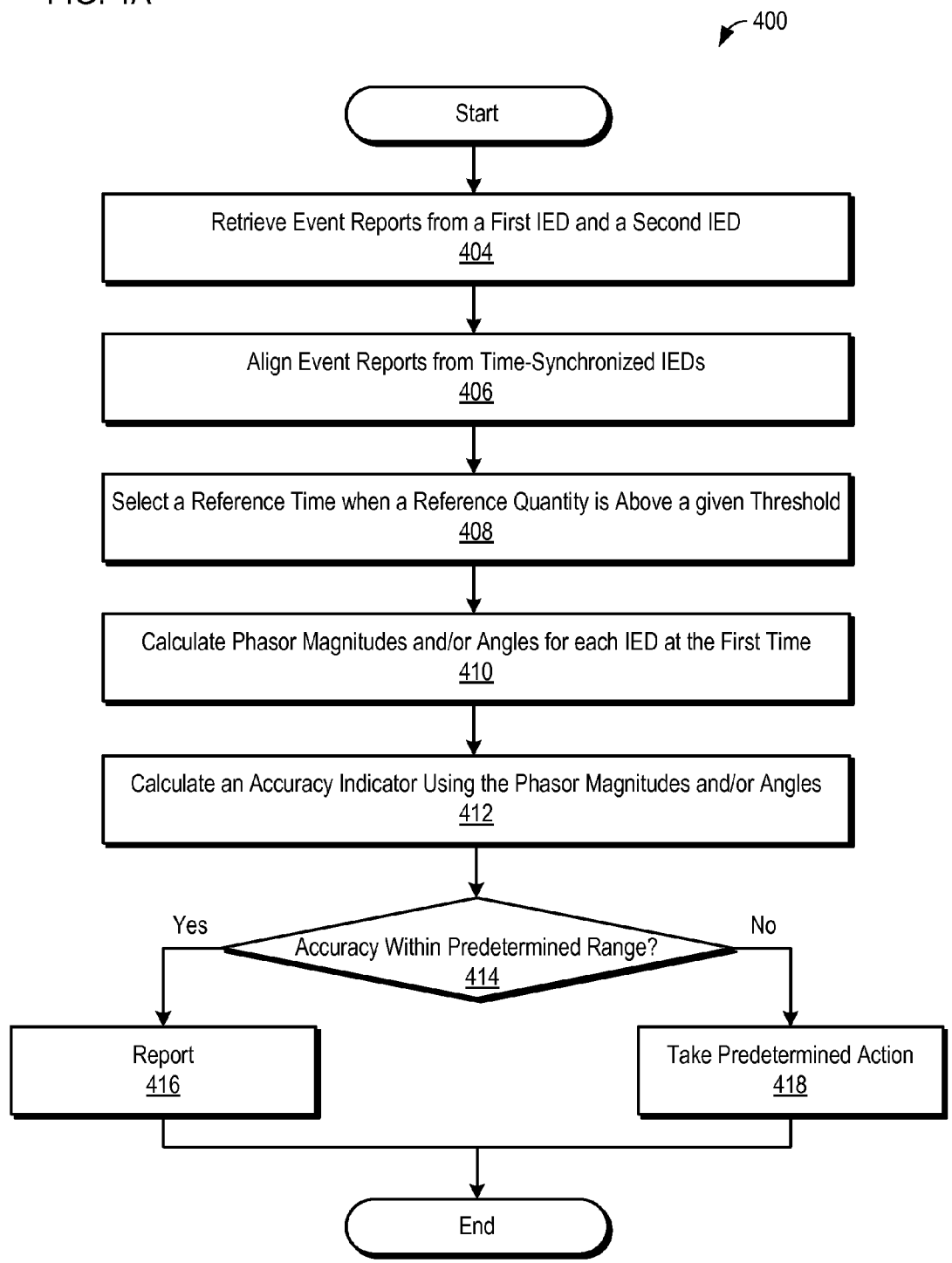
FIG. 4A illustrates a flow diagram of a method for validating monitoring systems, such as IEDs, voltage transformers, and current transformers, using time-synchronized IEDs.

FIG. 4A illustrates a flow diagram of a method 400 for validating monitoring systems that may include, for example, IEDs, monitoring equipment such as PTs, CTs, temperature sensors, light sensors, Rogowski coils, optical current transducers, generators, transformers, transmission lines, buses, circuit breakers, capacitor banks, switches, voltage regulators, tap changers, and/or other measurement equipment associated with electric power delivery systems.

As illustrated in the example method 400, a validation module may retrieve event reports from a first IED and a second IED, at 404. The first IED may provide an event report containing measurement data from a CT or a PT corresponding to an electric condition of a portion of an electric power delivery system. The second IED may provide an event report containing measurement data from a CT or a PT corresponding to the same electric condition of the same portion of the electric power delivery system. For example, each IED may provide an event report containing measurement data from a CT corresponding to a current flow in a conductor in the electric power delivery system.

In some embodiments, the first and second IEDs may be time-synchronized. Accordingly, time stamps associated with each event report may be synchronized. In such an embodiment, the validation module may then align the event reports from the time-synchronized IEDs, at 406. The validation module may then select a reference time when a reference quantity is above a given threshold, at 408. For example, the validation module may determine a current value above a predetermined threshold at a given time using the event report associated with a CT generated by the first IED. The validation module may then calculate phasor magnitudes and/or angles for each IED at the first time, at 410.

The validation module may compare the phasor magnitudes and/or angles from the first IED to those of the second IED in order to calculate an accuracy indicator using the phasor magnitudes and/or angles, at 412. For example, in order to calculate an accuracy indicator for the magnitudes, the validation module may take the difference between the magnitude associated with the first IED and the magnitude associated with the second IED, multiply the difference by 100, and then divide by the magnitude of the first IED. In order to calculate an accuracy indicator for the angles, the validation module may take the difference between the angle associated with the first IED and the angle associated with the second IED, multiply by 100, and divide by 180. If the accuracy indicator is within a predetermined range, at 414, then the validation module may report that the CT, or other measurement equipment, are functioning correctly, at 416. If the accuracy indicator is outside of a predetermined range, at 414, then the validation module may take a predetermined action, at 418, such as provide an alert or sound an alarm.

Figure 4B:
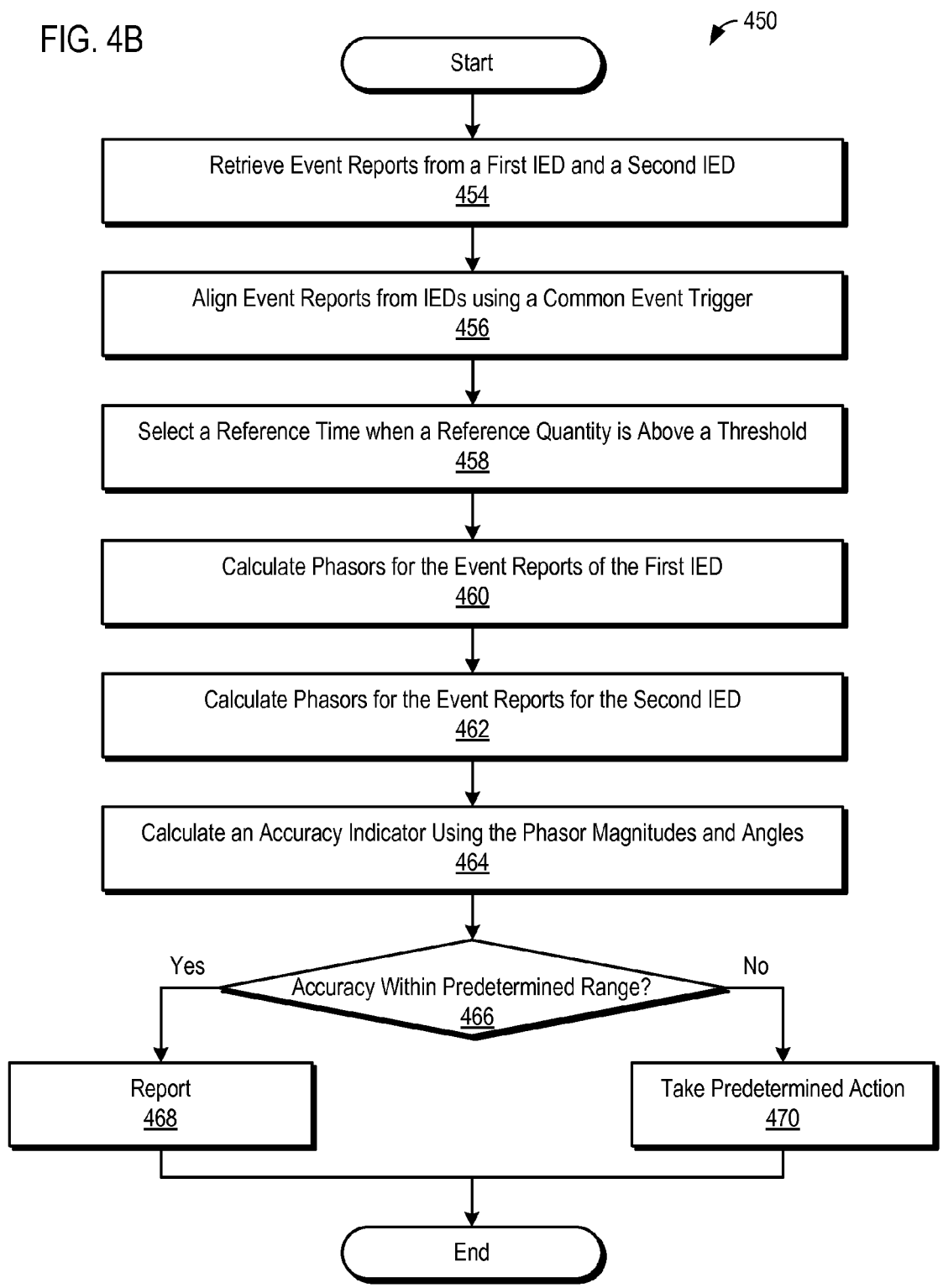
FIG. 4B illustrates a flow diagram of a method for validating monitoring systems by aligning the event reports generated by unsynchronized IEDs.

As previously described, in various embodiments a first IED and a second IED may not be time-synchronized. For example, each IED may utilize an independent time source and/or utilize a different sampling algorithm. FIG. 4B illustrates a method 450 for validating monitoring systems using unsynchronized IEDs. A validation module may retrieve event reports from a first IED and a second IED, at 454. The first IED may provide an event report containing measurement data from various CTs and PTs monitoring each phase of a three-phase electric power delivery system. The second IED may provide an event report containing measurement data from various CTs and PTs monitoring each phase of the same three-phase electric power delivery system. For example, each IED may provide an event report containing measurement data from a CT and a PT corresponding to a current flow and a voltage potential in each phase of a three-phase power conductor.

Since the first IED and the second IED may not be time-synchronized, the time stamps associated with each event report may also be unsynchronized. Accordingly, the validation module may then align the event reports using an event trigger common to both IEDs, at 456. For example, the first IED may generate an event trigger in response to the detection of an anomaly in the three-phase power system. A second IED may generate an event trigger in response to the same anomaly in the three-phase power system. Thus, while the time stamps for each of the first and second IEDs may be different, the validation module may use the common event triggers to align the event reports associated with each of the CTs and PTs.

The validation module may then select a reference time when a reference quantity is above a given threshold, at 458. For example, the validation module may determine a current or voltage value above a predetermined threshold at a given time using the event report associated with a CT or a PT generated by the first IED. The validation module may calculate phasor magnitudes and angles for the first IED at the reference time, at 460. The validation module may also calculate phasor magnitude and angles for the second IED at the reference time, at 462.

Table 1 below illustrates example measurements taken from two IEDs configured to monitor a three-phase power system using CTs and PTs.

TABLE 1

| First IED | | | Second IED | | |
|---|---|---|---|---|---|
| Channel | Magnitude | Angle | Channel | Magnitude | Angle |
| IA | 3965.2 | 0.0 | IA | 3775.3 | 0.0 |
| IB | 354.4 | 219.2 | IB | 352.8 | 215.8 |
| IC | 380.0 | 100.3 | IC | 375.0 | 96.4 |
| VA | 59.2 | 77.0 | VA | 60.0 | 77.1 |
| VB | 80.8 | 317.5 | VB | 80.5 | 314.8 |
| VC | 79.5 | 199.2 | VC | 79.5 | 196.2 |

As illustrated above, IED 1 may monitor phases A, B, and C using CTs and PTs in order to generate an event report containing measurement data. The validation module may then determine the phasor magnitude and angle for each channel, using the current on phase A, as measured by the first IED, as a reference quantity. Similarly the second IED may monitor phases A, B, and C using CTs and PTs in order to generate an event report containing measurement data. The validation module may determine the phasor magnitude and angle for each channel, using the current on phase A as a reference quantity.

The validation module may compare the phasor magnitudes and angles from the first IED to those of the second IED in order to calculate an accuracy indicator, at 464. Table 2 below illustrates accuracy indicators calculated for each CT and PT associated with each of phases A, B, and C.

TABLE 2

| | | | | | | Accuracy Indicator | |
|---|---|---|---|---|---|---|---|
| First IED | | | Second IED | | | Mag % | Angle % |
| Channel | Mag | Angle | Channel | Mag | Angle | Different | Different |
| IA | 3965.2 | 0.0 | IA | 3775.3 | 0.0 | 5.0% | 0.0% |
| IB | 354.4 | 219.2 | IB | 352.8 | 215.8 | 0.5% | 1.9% |
| IC | 380.0 | 100.3 | IC | 375.0 | 96.4 | 1.3% | 2.2% |
| VA | 59.2 | 77.0 | VA | 60.0 | 77.1 | 1.3% | 0.1% |
| VB | 80.8 | 317.5 | VB | 80.5 | 314.8 | 0.4% | 1.5% |
| VC | 79.5 | 199.2 | VC | 79.5 | 196.2 | 0.0% | 1.7% |

As illustrated above, in order to calculate an accuracy indicator for the magnitudes, the validation module may take the difference between the magnitude associated with the first IED and the magnitude associated with the second IED, multiply the difference by 100, and then divide by the magnitude of the first IED. In order to calculate an accuracy indicator for the angles, the validation module may take the difference between the angle associated with the first IED and the angle associated with the second IED, multiply by 100, and divide by 180. If an accuracy indicator is within a predetermined range, at 466, then the validation module may report that the measurement equipment, and/or the IEDs are functioning correctly, at 468. If an accuracy indicator is outside of a predetermined range, at 466, then the validation module may take a predetermined action, at 470, such as provide an alert or sound an alarm. Alternative methods, values, and algorithms may be used to calculate an accuracy indicator. The method used to calculate an accuracy indicator may be adapted and modified as is found useful without departing from the scope of the present disclosure.

The example illustrated in FIGS. 4A and 4B and described above shows calculation of an accuracy indicator for measurements at a single point (aligned voltages and current measurements at a single point). The validation device may calculate accuracy indicators for aligned measurement data at multiple points. For example, the validation device may calculate accuracy indicators for aligned measurement data for each aligned point for a predetermined set of measurements such as for 1 power system cycle, 1.5 power system cycles, a predetermined length of time, or the like. The validation device may be configured to take a predetermined action if any of the calculated accuracy indicators exceed a threshold. The validation device may be configured to take a predetermined action if an average of a set of the aligned measurement data exceeds a predetermined threshold.

FIG. 5 illustrates an example of a flow diagram of a method 500 for selecting a reference time when a reference quantity is above a predetermined threshold. A validation module may receive event reports from a first IED and a second IED. The validation module may then analyze the voltage and current magnitudes at a first time, at 550. In one embodiment, the validation module may determine a reference time based on an acceptable reference quantity between 0 and 10 cycles before or after an event trigger. In another embodiment, a reference time may be associated with an acceptable reference quantity at any time recorded in an event report.

As illustrated, if the voltage on phase A is above a voltage threshold, at 552, then the voltage on phase A at the first time may be used as a reference, at 554. Otherwise, if the voltage on phase B is above a voltage threshold, at 556, then the voltage on phase B at the first time may be used as a reference, at 558. Otherwise, if the voltage on phase C is above a voltage threshold, at 560, then the voltage on phase C at the first time may be used as a reference, at 562. Otherwise, if the current on phase A is above a current threshold, at 564, then the current on phase A at the first time may be used as a reference, at 566. Otherwise, if the current on phase B is above a current threshold, at 568, then the current on phase B at the first time may be used as a reference, at 570. Otherwise, if the current on phase C is above a current threshold, at 572, then the current on phase C at the first time may be used as a reference, at 574.

In the event that none of the voltages or currents are above their respective thresholds, at 552-572, then the time may be incremented, at 576, and the process repeated, beginning at 552, until a reference time can be selected that corresponds to a reference voltage or current that is above a minimum threshold. According to various embodiments, the voltage and/or current measurements on the three phases may be compared against the threshold values in any order. Moreover, in some embodiments, the voltage or current with the highest magnitude may be chosen if more than one voltage or current measurement is above a threshold voltage or current.

Figure 6:
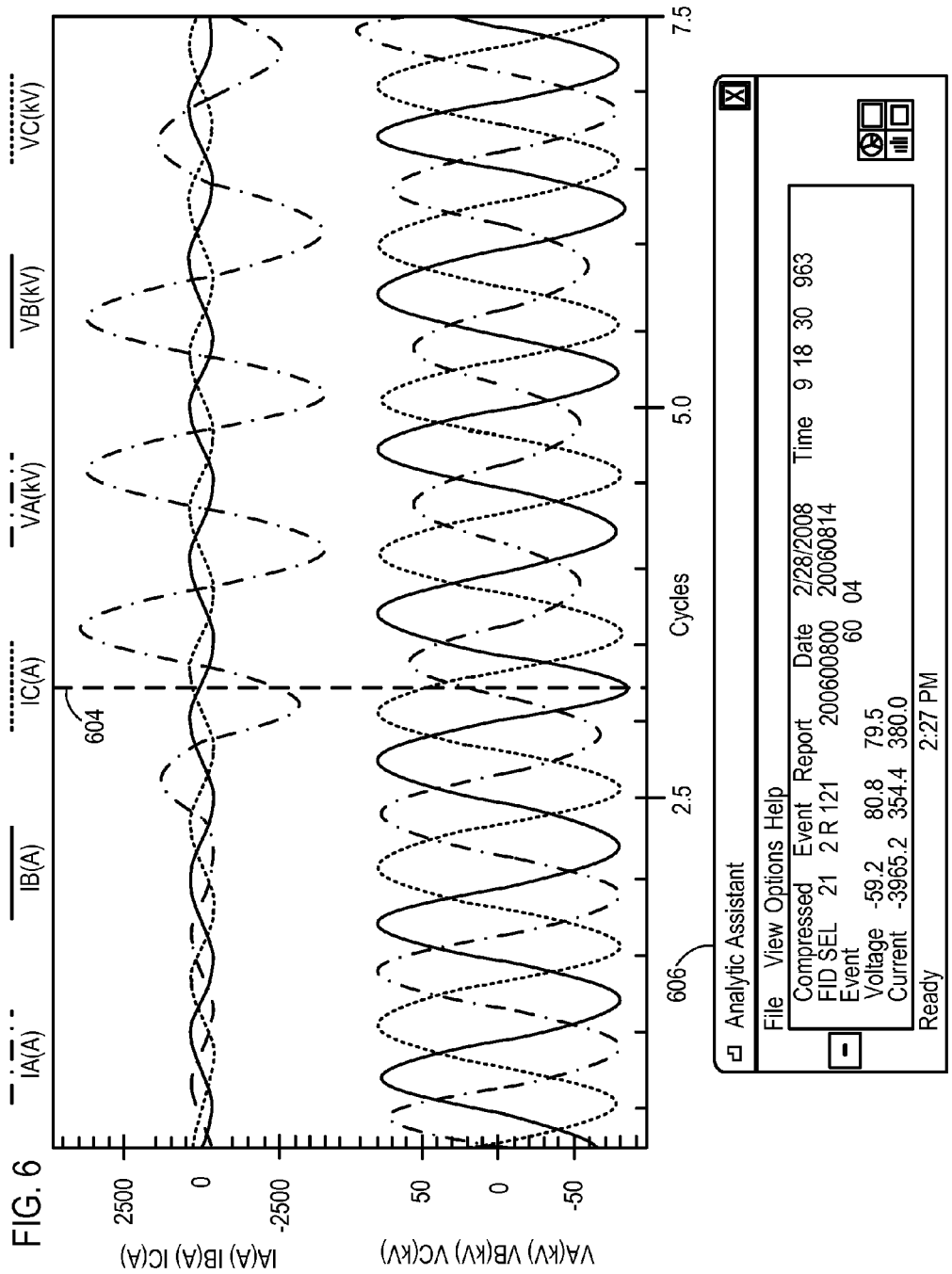
FIG. 6 illustrates an oscillography event report generated by a first IED, including voltage and current measurements for three phases of power in an electric power delivery system.

FIGS. 6 and 7 illustrate oscillography event reports including voltage and current measurements for three phases of power in an electric power delivery system. FIG. 6 illustrates measurements collected by a first IED from CTs and PTs in communication with phases A, B, and C of a segment in the electric power delivery system. FIG. 7 illustrates measurements collected by a second IED from CTs and PTs in communication with the same three phases, phases A, B, and C, of the same segment in the electric power delivery system. In the illustrated embodiment, the first IED (FIG. 6) and the second IED (FIG. 7) are not time-synchronized. The illustrated oscillography reports are merely examples and may not be to scale or accurate representations of real-world voltage and current measurements.

The first IED (FIG. 6) may have detected an event and inserted an event trigger 604 at about cycle 3.25, after which the current of phase A can be seen to dramatically increase. Additionally, the voltage of phase A can be seen to slightly decrease at after event trigger 604. Analytic assistant window 606 may provide numerical information, such as time stamps, dates, and voltage and current measurements. As illustrated within the analytic assistant window 606, at the event trigger, or shortly thereafter, the current on phases A, B, and C may have magnitudes of 3965.2, 354.4, and 380.0, respectively. The voltage on phases A, B, and C may have magnitudes of 59.2, 80.8, and 79.5, respectively.

The second IED (FIG. 7) may have detected an event and inserted an event trigger 704 at about cycle 2, after which the current of phase A can be seen to dramatically increase. Additionally, the voltage of phase A can be seen to slightly decrease after event trigger 704. Analytic assistant window 706 may provide numerical information, such as time stamps, dates, and voltage and current measurements. At the event trigger, or shortly thereafter, the current on phases A, B, and C may have magnitudes of 3775.3, 352.8, and 375.0, respectively. The voltage on phases A, B, and C may have magnitudes of 60.0, 80.5, and 79.5, respectively.

Comparing FIGS. 6 and 7, it can be seen that each IED recorded the same event, but with different time stamps. A validation module may utilize any one of the previously described methods to align the event reports of FIGS. 6 and 7 in order to validate that the various CTs, PTs, and/or the IEDs are functioning correctly. For example, the validation module may align the event reports using the event triggers 604 and 704. The validation module may select a reference time when a reference quantity is above a given threshold. The magnitude of the current on phase A in FIG. 6 at the time of the event trigger may be used as a reference quantity.

The validation module may calculate phasor magnitudes and angles for the first IED (FIG. 6) at the reference time (i.e. at the time of the event trigger). The validation module may also calculate phasor magnitude and angles for the second IED (FIG. 7) at the reference time. Table 1, included above, corresponds to the oscillography reports of FIGS. 6 and 7.

Since the first IED and the second IED may not be perfectly time-synchronized and/or may utilize different sampling and/or processing algorithms, the phasor magnitudes and angles may not be identical. Accordingly, the validation module may calculate an accuracy indicator for each set of data, as illustrated in Table 2 above. If the accuracy indicators are within predetermined acceptable thresholds, then the validation module may validate the monitoring system, including the associated measurement equipment, such as the underlying CTs and/or PTs, and/or associated IEDs. Otherwise, if the accuracy indicators are outside of predetermined thresholds, then the validation module may provide an alert or sound an alarm.

The above description provides numerous specific details for a thorough understanding of the embodiments described herein. However, those of skill in the art will recognize that one or more of the specific details may be omitted, modified, and/or replaced by a similar process or system.

What is claimed:

1. A system for validating a monitoring system of an electric power delivery system, comprising:
   a first measurement equipment configured to generate a first signal corresponding to an electrical condition of the electric power delivery system;
   a second measurement equipment configured to generate a second signal corresponding to the electrical condition of the electric power delivery system;
   a monitoring system in communication with the first measurement equipment and the second measurement equipment, the monitoring system configured to:
      receive the first signal from the first measurement equipment and generate a first set of measurement data; and
      receive the second signal from the second measurement equipment and generate a second set of measurement data; and
   a validation module configured to validate the functionality of the first measurement equipment relative to the second measurement equipment, the validation module configured to:
      receive the first and second sets of measurement data;
      align the first set of measurement data with the second set of measurement data, using a first event trigger generated from the first signal and a second event trigger generated from the second signal, such that the first and second sets of measurement data are aligned;
      determine a reference quantity from the first set of measurement data at a first time along the aligned first and second sets of measurement data;
      determine a comparison quantity from the second set of measurement data the first time along the aligned first and second sets of measurement data;
      calculate an accuracy indication using a difference between the reference quantity and the comparison quantity; and determine if the accuracy indication is within a predetermined threshold range of accuracy.

2. The system of claim 1, wherein the validation module is configured to provide an alert when the accuracy indication is outside of a predetermined threshold accuracy range.

3. The system of claim 1, wherein the first measurement equipment comprises a first current transformer and the second measurement equipment comprises a second current transformer.

4. The system of claim 1, wherein the first measurement equipment comprises a first potential transformer and the second measurement equipment comprises a second potential transformer.

5. The system of claim 1, wherein the reference quantity from the first set of measurement data comprises a phasor magnitude and angle corresponding to the first set of measurement data at the first time, and
wherein the comparison quantity from the second set of measurement data comprises a phasor magnitude and angle corresponding to the second set of measurement data at the first time.

6. The system of claim 1, wherein the monitoring system comprises:
a first intelligent electronic device (IED) in communication with the first measurement equipment, the first IED configured to receive the first signal from the first measurement equipment and generate the first set of measurement data; and
a second IED in communication with the second measurement equipment, the second IED configured to receive the second signal from the second measurement equipment and generate the second set of measurement data.

7. The system of claim 6, wherein the validation module is integrated within one of the first and second IEDs, and
wherein the first and second IEDs are in communication with one another.

8. The system of claim 6, wherein the validation module is integrated within a validation device in communication with the first and second IEDs.

9. The system of claim 6, wherein the first event trigger is common with the second event trigger.

10. The system of claim 9, wherein the first event trigger and the second event trigger are generated by an external source and provided to each of the first IED and the second IED.

11. The system of claim 9, wherein the first event trigger is automatically generated by the first IED and the second event trigger is automatically generated by the second IED in response to a change in the electrical condition in the electric power delivery system.

12. The system of claim 11, wherein the first and second event triggers are automatically generated in response to the detection of one of an overcurrent, an undercurrent, a overvoltage, voltage drop, overfrequency, underfrequency, and change in frequency.

13. The system of claim 1, wherein the monitoring system comprises the first measurement equipment and the second measurement equipment.

14. A method for validating a monitoring system of an electric power delivery system, comprising:
generating a first signal corresponding to an electrical condition of the electric power delivery system using a first measurement equipment;
generating a second signal corresponding to the electrical condition of the electric power delivery system using a second measurement equipment;
receiving the first signal from the first measurement equipment and generating a first set of measurement data using a monitoring system;
receiving the second signal from the second measurement equipment and generating a second set of measurement data;
receiving, by a validation module, the first and second sets of measurement data;
generating a first event trigger from the first signal;
generating a second event trigger from the second signal;
aligning the first set of measurement data with the second set of measurement data using the first event trigger and the second event trigger, such that the first and second sets of measurement data are aligned;
determining a reference quantity from the first set of measurement data at a first time along the aligned first and second sets of measurement data;
determining a comparison quantity from the second set of measurement data the first time along the aligned first and second sets of measurement data;
calculating an accuracy indication using a difference between the reference quantity and the comparison quantity; and
determining if the accuracy indication is within a predetermined threshold range of accuracy.

15. The method of claim 14, further comprising the validation module providing an alert when the accuracy indication is outside of a predetermined threshold accuracy range.

16. The method of claim 14, wherein the first measurement equipment comprises a first current transformer and the second measurement equipment comprises a second current transformer.

17. The method of claim 14, wherein the first measurement equipment comprises a first potential transformer and the second measurement equipment comprises a second potential transformer.

18. The method of claim 14, wherein determining a reference quantity from the first set of measurement data comprises determining a phasor magnitude and angle corresponding to the first set of measurement data at the first time, and
wherein determining a comparison quantity from the second set of measurement data comprises determining a phasor magnitude and angle corresponding to the second set of measurement data at the first time.

19. The method of claim 14, wherein the monitoring system comprises:
a first intelligent electronic device (IED) and a second IED, and
wherein receiving the first signal from the first measurement equipment and generating the first set of measurement data is performed by the first IED, and
wherein receiving the second signal from the second measurement equipment and generating the second set of measurement data is performed by the second IED.

20. The method of claim 19, wherein the validation module is integrated within one of the first and second IEDs, and
wherein the first and second IEDs are in communication with one another.

21. The method of claim 19, wherein the validation module is integrated within a validation device in communication with the first and second IEDs.

22. The method of claim 19, wherein the first event trigger is common with the second event trigger.

23. The method of claim 22, wherein the first event trigger and the second event trigger are generated by an external source and provided to each of the first IED and the second IED.

24. The method of claim 22, wherein the first event trigger is automatically generated by the first IED and the second event trigger is automatically generated by the second IED in response to a change in the electrical condition in the electric power delivery system.

25. The method of claim 24, wherein the first and second event triggers are automatically generated in response to the detection of one of an overcurrent, an undercurrent, a overvoltage, voltage drop, overfrequency, underfrequency, and change in frequency.

26. The method of claim 14, wherein the monitoring system comprises the first measurement equipment and the second measurement equipment.

27. A system for validating a monitoring system of an electric power delivery system, comprising:
- a monitoring system in communication with the electric power delivery system configured to:
    - obtain a first signal corresponding to an electrical condition of the electric power delivery system and generate a first set of measurement data therefrom; and,
    - obtain a second signal corresponding to an electrical condition of the electric power delivery system and generate a second set of measurement data therefrom;
- generate a first event trigger from the first signal;
- generate a second event trigger from the second signal;
- a validation module in communication with the monitoring system, and configured to:
- receive the first and second sets of measurement data;
- align the first and second sets of measurement data using the first and second event triggers, wherein the first and second event triggers correspond to an event common to the first and second sets of measurement data; and,
- calculate an accuracy indication using the aligned first and second sets of measurement data.

* * * * *